United States Patent [19]

Ichihashi

[11] Patent Number: 5,444,286
[45] Date of Patent: Aug. 22, 1995

[54] PACKAGED SEMICONDUCTOR PRESSURE SENSOR INCLUDING LEAD SUPPORTS WITHIN THE PACKAGE

[75] Inventor: Motomi Ichihashi, Itami, Japan

[73] Assignee: Mitsubishi Denki Kabushiki Kaisha, Tokyo, Japan

[21] Appl. No.: 190,894

[22] Filed: Feb. 3, 1994

[30] Foreign Application Priority Data

Feb. 4, 1993 [JP] Japan .................. 5-017425

[51] Int. Cl.6 .................................... H01L 23/12
[52] U.S. Cl. ................................. 257/420; 257/710; 73/754
[58] Field of Search ............... 257/414, 415, 417, 418, 257/419, 420, 669, 704, 710; 73/720, 721, 726, 727, 754, 756

[56] References Cited

U.S. PATENT DOCUMENTS

| 4,651,192 | 3/1987 | Matsushita et al. | 257/704 |
| 4,780,572 | 10/1988 | Kondo et al. | 73/754 |
| 5,302,852 | 4/1994 | Kaneda et al. | 257/710 |

FOREIGN PATENT DOCUMENTS

| 54-129880 | 10/1979 | Japan | 257/710 |
| 62-249459 | 10/1987 | Japan | 257/710 |
| 63-45840 | 2/1988 | Japan | 257/710 |
| 63-104382 | 5/1988 | Japan | 257/417 |
| 63-163248 | 7/1988 | Japan | 73/756 |
| 63-241326 | 10/1988 | Japan | 257/415 |
| 1-244326 | 9/1989 | Japan | 73/754 |
| 2-105443 | 4/1990 | Japan | 257/710 |
| 4-130670 | 5/1992 | Japan | 257/419 |

Primary Examiner—William Mintel
Assistant Examiner—Minhloan Tran
Attorney, Agent, or Firm—Leydig, Voit & Mayer

[57] ABSTRACT

A semiconductor pressure sensor has a package base provided with an adhesive supporting portion for supporting nearly the entire lengths of inner portions of outer leads. Since nearly the entire lengths of the inner portions in a package are supported, the inner portions do not resonate even if the semiconductor pressure sensor vibrates, thereby preventing detachment of the wires bonded to the ends of the inner portions.

2 Claims, 2 Drawing Sheets

PACKAGED SEMICONDUCTOR PRESSURE SENSOR INCLUDING LEAD SUPPORTS WITHIN THE PACKAGE

BACKGROUND OF THE INVENTION

1. Field of the Invention

The present invention relates to a semiconductor pressure sensor and, particularly, to a semiconductor pressure sensor used in automobiles or the like.

2. Description of the Related Art

FIG. 4 is a sectional side view illustrating a conventional hollow package type semiconductor pressure sensor. In FIG. 4, a semiconductor pressure sensor chip 1 having a gage resistance (not shown) thereon is bonded to a pedestal, for example, a glass pedestal 2. The glass pedestal 2 is mounted on a die pad 3 by using, for example, a resin adhesive 8a. The die pad 3 is a portion of a lead frame (not shown) which is also provided with outer leads 4. The die pad 3 is fixed to the bottom of a package base 6 by an adhesive 8b so that the semiconductor pressure sensor chip 1, the glass pedestal 2 and the die pad 3 are contained in the package base 6.

The outer leads 4 of the lead frame, which is integral with the die pad 3, are fixed to the upper end of the package base 6 by an adhesive 8c. A package cap 7 which has an opening 7a to form a hollow portion is also fixed to the upper end of the package base 6 by an adhesive 8d so as to cover the semiconductor pressure sensor chip 1 to form a package. The inner portions of the outer leads 4 are electrically connected to electrodes (not shown) formed on the semiconductor pressure sensor chip 1 by wires 5 serving as electrical connection means. The package base 6 and the package cap 7, for example, are made of an epoxy resin.

In the conventional semiconductor pressure sensor constructed as described above, a diaphragm region 1a in the semiconductor pressure sensor chip 1 serves as a vacuum chamber when the semiconductor pressure sensor chip 1 is bonded to the glass pedestal 2 in a vacuum by, for example, anodic bonding. When the vacuum chamber is at a reference pressure, and when outer pressure is applied to the surface of the semiconductor pressure sensor chip 1 from the opening 7a of the package cap 7, the thin diaphragm is distorted, and the value of the gage resistance (not shown) on the semiconductor pressure sensor chip 1 is changed by the piezoresistance effect and generates an output signal corresponding to the pressure in a bridge circuit comprising the gage resistance. The generated output signal is output from the outer leads 4 through the wires 5.

In the aforementioned semiconductor pressure sensor, the ends 4a of the outer leads are cantilevered and not fixed within the package. There is thus the problem that when vibration is applied to the semiconductor pressure sensor mounted on an automobile or the like, the ends 4a resonate, and the wires 5 bonded to the ends 4a are detached due to vibration. Although the inner leads can be shortened for preventing the problem, undesirable interference such as contact between the wires 5 and the adhesive 8d occurs when the package base 6 and the package cap 7 are bonded to the outer leads 4. It is thus impossible to prevent the wires 5 from being detached due to vibration.

SUMMARY OF THE INVENTION

The present invention has been achieved for solving the above problem, and an object of the present invention is to provide a semiconductor pressure sensor comprising outer leads having inner portions within a package which do not resonate even if vibration is applied thereto, thereby preventing detachment of wires.

In order to achieve the object, a semiconductor pressure sensor of the present invention comprises a semiconductor pressure sensor chip, a package base supporting the semiconductor pressure sensor chip, a package cap which is combined with the package base to form a package containing the semiconductor pressure sensor chip, outer being held between the package base and the package cap and having inner portions inside the package and outer portions outside the package, adhesives provided between the package base, the package cap and the outer leads bonding and hermetically sealing them, and electrical connection means for electrical connecting the inner portions of the outer leads to the semiconductor pressure sensor chip. The package base has an adhesive supporting portion for supporting nearly the entire lengths of the inner portions of the outer leads.

DESCRIPTION OF THE EMBODIMENTS

Embodiment 1

Figure 1:
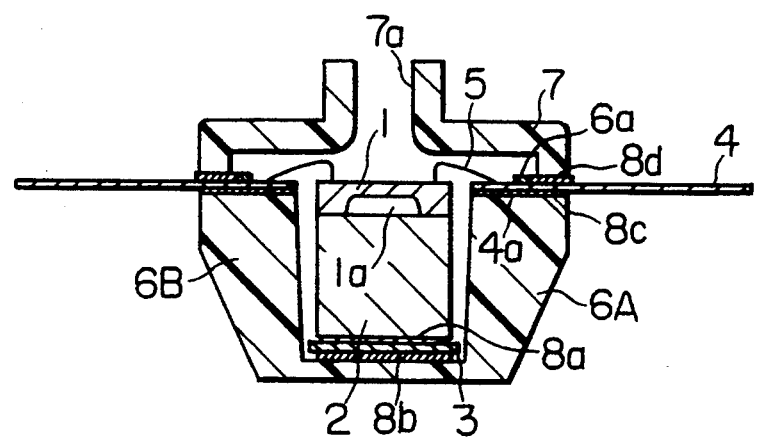
FIG. 1 is a sectional side view illustrating a semiconductor pressure sensor according to Embodiment 1 of the present invention.
Figure 2:
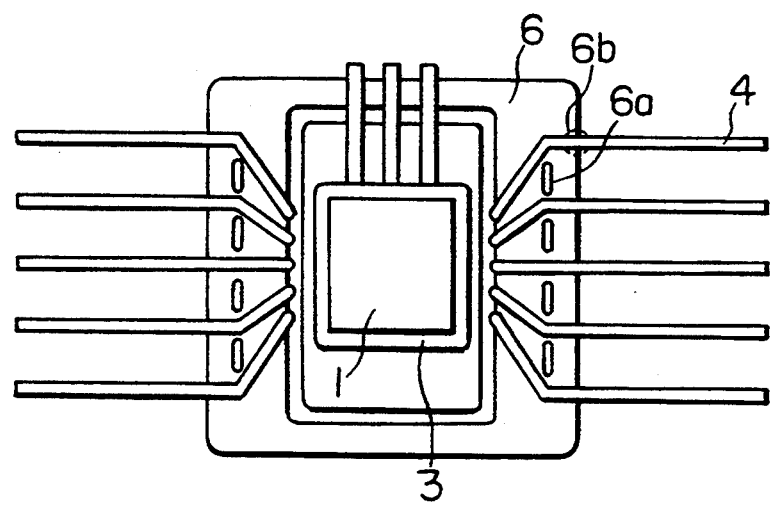
FIG. 2 is a plan view illustrating the state wherein the package cap of the semiconductor pressure sensor shown in FIG. 1 is removed.

FIG. 1 is a sectional side view illustrating a semiconductor pressure sensor according to Embodiment 1 of the present invention, and FIG. 2 is a plan view illustrating the same semiconductor pressure sensor without a package cap. In all of the drawings, the same reference numerals respectively denote the same or equivalent portions. In the drawings, a package base 6A has an adhesive supporting portion 6B for supporting nearly the entire lengths of the outer lead inner portions 4a within the package. On the surface of the package base 6A which is bonded to the package cap 7 are provided adhesive positioning projections 6a for determining regions of adhesion to the package cap 7. The adhesive positioning projections 6a prevent fluid adhesives 8c and 8d from contacting the wires 5 bonded to the ends 4a due to capillary phenomenon when the package base 6A is bonded to the package cap 7 with the adhesives 8c and 8d, and prevent the adhesives 8c and 8d from transferring to the ends 4a and decreasing in amount in the vicinity of each of the outer lead adhesion portions 6b. It is thus possible to prevent deterioration in the adhesion between the package base 6A and the package cap 7 in the vicinity of each of the outer lead adhesion portions 6b.

In the semiconductor pressure sensor constructed as described above, the outer leads 4 for outputting a signal corresponding to a pressure from the semiconductor pressure sensor chip 1 are electrically connected to the semiconductor pressure sensor chip 1 by the wires 5 serving as electrical connection means. The operation of outputting the output voltage corresponding to the pressure from the outer leads 4 is the same as that of the conventional sensor.

The adhesion area of each of the outer leads 4 is increased for preventing a cantilevered state, thereby inhibiting resonance at the ends of the outer leads 4 and preventing detachment of the wires 5. In addition, since the adhesive positioning projections 6a permit the adhesives 8c and 8d to be held in the adhesion portion between the package base 6A and the package cap 7, it is possible to prevent decreases in the amounts of the adhesives 8c and 8d in each of the outer lead adhesion portions 6b and prevent deterioration in the airtightness of the package. Thus, the leakage of gases from the adhesion surface between the package base 6A and the package cap 7 is decreased, and the airtightness of the package is improved, thereby improving the measurement precision. A semiconductor pressure sensor having high reliability is thus obtained.

Embodiment 2

Figure 3:
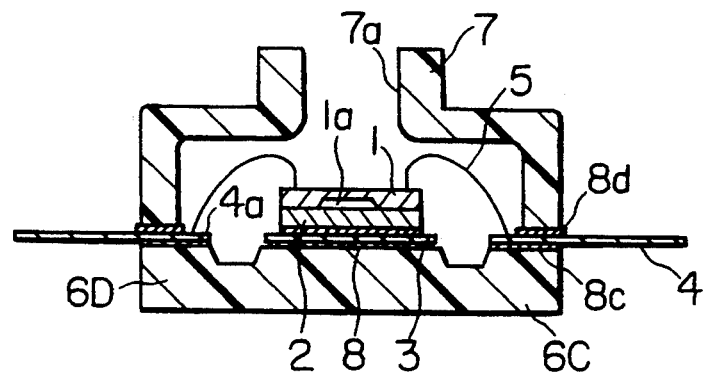
FIG. 3 is a sectional side view illustrating a semiconductor pressure sensor according to Embodiment 2 of the present invention.
Figure 4:
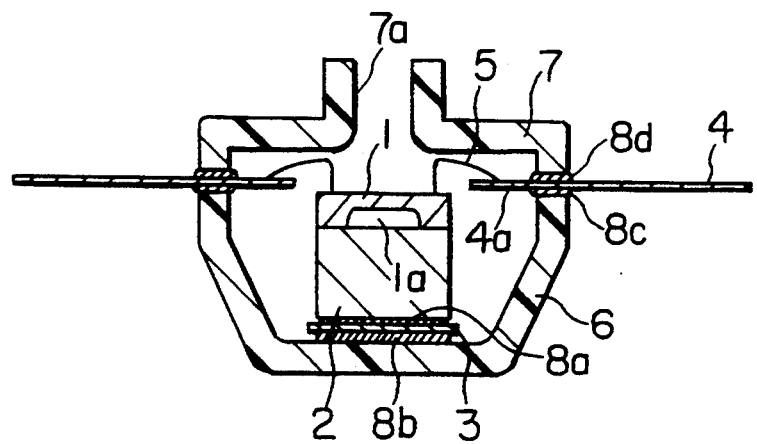
FIG. 4 is a sectional side view illustrating a conventional semiconductor pressure sensor.

FIG. 3 is a sectional side view illustrating a semiconductor pressure sensor according to Embodiment 2 of the present invention. In FIG. 3, an adhesive supporting portion 6D of a package base 6C which is bonded to a package cap 7 supports nearly the entire lengths of the outer lead portions within the package. Although in Embodiment 1 the die pad 3 is placed below the outer leads 4 at a height different from that of the outer leads 4, the die pad 3 and the outer leads are in one plane in the semiconductor pressure sensor according to Embodiment 2.

In the package base 6C having the above-described structure, it is unnecessary to place the die pad below the lead frame. It is thus possible to omit the step of sinking the die pad relative to the leads and decrease the number of the steps. It is also possible to keep the package base 6C at a low height and miniaturize of the package. Since the die pad 3 is not sunk, the die pad 3 does not vertically move in the state where only the lead frame is present in the production process, and the stress on the wires 5 is also decreased. A double-supported structure in which the die pad 3 is supported on both sides can also be employed.

As described above, the semiconductor pressure sensor of the present invention has improved vibration resistance, and can inhibit resonance of the lead portions within the package and prevent detachment of the wires bonded to the ends of the outer lead inner portions. The present invention also has the effect of facilitating the determination of the adhesion region between the package base and the package cap, and preventing outflow of the adhesives to the ends of the outer leads. In addition, since the adhesion of the package near the lead out adhesion portions does not deteriorate, the airtightness in the package is not decreased, thereby achieving a semiconductor pressure sensor having high measurement precision and reliability. Further, since the outer leads and the die pad are in one plane, vibration resistance is improved, and resonance of the outer lead inner portions within the package can thus be inhibited, thereby preventing detachment of the wires bonded to the ends of the outer lead inner portions. Since the step of sinking the die pad can be omitted, the number of steps can be decreased, and the package base can be kept at a low height, thereby miniaturizing the package.

What is claimed is:

1. A semiconductor pressure sensor comprising:
   a semiconductor pressure sensor chip mounted on a die pad;
   a package base supporting said semiconductor pressure sensor chip and said die pad;
   a package cap combined with said package base to form a package containing said semiconductor pressure sensor chip;
   outer leads held between said package base and said package cap and having inner portions within said package and outer portions outside said package;
   an adhesive disposed between said package base, said package cap, and said outer leads bonding and hermetically sealing said package base, package cap, and outer leads; and
   electrical connection means electrically connecting said inner portions of said outer leads to said semiconductor pressure sensor chip, wherein said package base has an adhesive supporting portion supporting nearly all of each of said inner portions of said outer leads and including adhesive positioning projections for limiting flow of said adhesive.

2. The sensor according to claim 1 wherein said outer leads and said die pad are located in a common plane.

* * * * *